United States Patent
Ueyama et al.

(10) Patent No.: US 6,926,057 B2
(45) Date of Patent: Aug. 9, 2005

(54) THIN FILM FORMING APPARATUS AND THIN FILM FORMING METHOD

(75) Inventors: Tsutomu Ueyama, Kyoto (JP); Izuru Iseki, Kyoto (JP)

(73) Assignee: Dainippon Screen Mfg. Co., Ltd. (JP)

(*) Notice: Subject to any disclaimer, the term of this patent is extended or adjusted under 35 U.S.C. 154(b) by 142 days.

(21) Appl. No.: 10/216,002

(22) Filed: Aug. 8, 2002

(65) Prior Publication Data
US 2003/0056890 A1 Mar. 27, 2003

(30) Foreign Application Priority Data

Sep. 25, 2001 (JP) ........................................ 2001-290719
Sep. 27, 2001 (JP) ........................................ 2001-296037

(51) Int. Cl.[7] ....................... H01L 21/31; H01L 21/316; B32B 35/00
(52) U.S. Cl. ....................... 156/540; 156/285; 156/230; 156/381; 156/583.1; 29/729; 438/455; 427/147; 118/58
(58) Field of Search ........................... 29/729; 156/540, 156/285, 230, 381, 583.1, 286, 232, 358, 350, 366, 387, 510, 527, 530, 242, 249; 427/147, 146, 148.96; 118/58; 438/455, 458, 459

(56) References Cited

U.S. PATENT DOCUMENTS

| | | | |
|---|---|---|---|
| 4,869,767 A | * | 9/1989 | Robinson et al. ............ 156/233 |
| 5,017,255 A | * | 5/1991 | Calhoun et al. ............. 156/230 |
| 5,259,926 A | | 11/1993 | Kuwabara et al. ......... 156/659.1 |

FOREIGN PATENT DOCUMENTS

| | | |
|---|---|---|
| EP | 1 072 954 A2 | 1/2001 |
| JP | 5-80530 | 4/1993 |
| JP | 2001-135634 | 5/2001 |
| KR | 2001-0030001 | 4/2001 |

* cited by examiner

*Primary Examiner*—Sue A. Purvis
(74) *Attorney, Agent, or Firm*—Ostrolenk, Faber, Gerb & Soffen, LLP

(57) ABSTRACT

Apparatus for forming a thin film pattern on the surface of a substrate. This apparatus is provided with: a transfer member having a thin film carrying surface which carries a thin film pattern; and a thin film transfer mechanism for joining the transfer member to a substrate for transferring, to the substrate, the thin film pattern on the thin film carrying surface. The thin film pattern may be a wiring film pattern. A gelatinous film may previously be formed on the substrate, and the thin film pattern may be transferred as embedded in the gelatinous film.

16 Claims, 10 Drawing Sheets

THIN FILM FORMING APPARATUS AND THIN FILM FORMING METHOD

BACKGROUND OF THE INVENTION

1. Field of the Invention

The present invention relates to thin film forming apparatus for and thin film forming method of forming a thin film pattern or a plurality of thin films on a surface of any of a variety of substrates such as a semiconductor wafer, a glass substrate for a liquid-crystal-display-panel, a glass substrate for a plasma-display-panel, a photo mask substrate, a print-circuit board and the like.

2. Description of Related Art

A damascene method is known as an example of the method of forming a metallic wiring such as a copper wiring or the like on a surface of a semiconductor wafer (hereinafter simply referred to as wafer). FIGS. 11A to 11D show a wiring forming process according to the damascene method.

Formed on the wafer 1 is an insulating film 2, on which there are pattern-formed resists 3 having openings 3a corresponding to a metallic wiring pattern to be formed (FIG. 11A). With the use of the resists 3 as masks, etching is conducted, thus forming, in the insulating film 2, openings or recess portions 2a corresponding to the wiring pattern to be formed (FIG. 11B).

Then, a wiring metallic film 4 is formed all over the surface of the wafer 1 in such thickness that the openings or recess portions 2a are entirely buried (FIG. 11C). Then, according to a CMP (chemical mechanical polishing) method, the metallic film 4 is ground or polished until the surface of the insulating film 2 is exposed. This forms metallic wiring patterns 4W embedded in the openings or recess portions 2a in the insulating film 2 as shown in FIG. 11D.

However, the wiring forming process above-mentioned requires not only patterning with photolithography applied to the insulating film 2 on the wafer 1, but also grinding or polishing the entire surface of the wiring metallic film 4 according to the CMP method. This makes the process complicated, disadvantageously increasing the wiring pattern forming cost.

On the other hand, a transfer method is known as an example of the method of forming an interlayer insulating film on the surface of a semiconductor wafer. According to this transfer method, another sheet different from the semiconductor wafer is coated at its surface with an interlayer insulating film material, thus forming a coated film. This sheet having the coated film formed thereon and the semiconductor wafer are laminated on each other. Then, only the sheet is separated from the semiconductor wafer, thus transferring the coated film from the sheet to the semiconductor wafer.

The use of the thin film forming method according to this transfer method, can eliminate the problem of voids encountered with forming of an SOG (Spin On Glass) layer with the use of a spin-coater. Further, a flat interlayer insulating film can be formed without a flattening processing such as a CMP method or the like.

In a recent semiconductor integrated circuit having a complicated arrangement, however, a number of thin films are formed on the surface of the substrate as typically seen in the case where multi-layer wirings are formed on a semiconductor substrate. In such a case, when there is used the prior art above-mentioned in which only one-type thin film is transferred, at one time, from the sheet to the semiconductor wafer, it is required to execute the transferring processing many times. This complicates the production process, thus disadvantageously increasing the semiconductor production cost.

SUMMARY OF THE INVENTION

It is a first object of the present invention to provide a thin film forming apparatus capable of forming a thin film pattern on a substrate with a simple and economical process.

It is a second object of the present invention to provide a thin film forming method capable of forming a thin film pattern on a substrate with a simple and economical process.

It is a third object of the present invention to provide a substrate processing apparatus capable of forming a thin film pattern on a substrate with a simple and economical process.

It is a fourth object of the present invention to provide a thin film forming apparatus capable of transferring a plurality of thin films to a substrate with a fewer number of transfer times, thereby simplifying the process to accordingly reduce the thin film forming processing cost.

It is a fifth object of the present invention to provide a thin film forming method capable of transferring a plurality of thin films to a substrate with a fewer number of transfer times, thereby simplifying the process to accordingly reduce the thin film forming processing cost.

A first thin film forming apparatus according to the present invention, is arranged to form a thin film pattern on the surface of a substrate, and comprises: a transfer member having a thin film carrying surface which carries a thin film pattern; and a thin film transfer mechanism for joining the transfer member and a substrate to each other for transferring, to the substrate, the thin film pattern on the thin film carrying surface.

A first thin film forming method according to the present invention, is arranged to form a thin film pattern on the surface of a substrate, and comprises the steps of: forming a thin film pattern on a thin film carrying surface of a transfer member; and joining the transfer member and a substrate to each other for transferring, to the substrate, the thin film pattern on the thin film carrying surface.

The substrate may be a substrate on which a fine wiring pattern or device is to be formed. Examples of the substrate include a semiconductor substrate, a glass substrate for a liquid-crystal-display-panel, a glass substrate for a plasma-display-panel, a print-circuit board and the like.

The thin film pattern formed on the substrate surface may be a wiring film pattern. This wiring film pattern may be a sunken wiring film pattern to be embedded in a film (insulating film or the like) formed on the substrate.

For example, provision may be made such that a gelatinous film (insulating film or the like) is previously formed on the substrate, and that the substrate and the transfer member are joined to each other to transfer, to the substrate, the thin film pattern (wiring film pattern or the like) on the transfer member so that the thin film pattern is embedded in the gelatinous film thereon.

The transfer member may be provided on a surface thereof with a recess portion and a projecting portion, and the thin film carrying surface may be formed on the surface of the projecting portion.

The transfer member may have a flat surface and the thin film pattern may be formed on a predetermined area of the flat surface.

When the thin film pattern is a metallic film pattern (wiring film pattern or the like), the thin film pattern can be formed on the transfer member by a plating method (either electroless plating or electroplating).

According to the present invention, a substrate and the transfer member which carries a thin film pattern, are joined to each other for transferring, to the substrate, the thin film pattern on the transfer member, thus enabling the thin film pattern to be formed on the substrate. Accordingly, when a desired thin film pattern is previously formed on the transfer member, the thin film pattern can be formed on the substrate without a photolithography processing executed on the substrate.

Further, when a gelatinous film is previously formed on the substrate, the thin film pattern on the transfer member can be transferred to the substrate such that the thin film pattern is embedded in the gelatinous film. Accordingly, the wiring film pattern embedded in the insulating film can be formed without for example a CMP process required.

A second thin film forming apparatus according to the present invention, is arranged to form a plurality of thin films on a substrate, and comprises: a transfer member which carries a plurality of thin films; and a transfer mechanism for joining the transfer member and the substrate to each other for collectively transferring, to the substrate, a plurality of thin films carried by the transfer member.

A second thin film forming method according to the present invention, is arranged to form a plurality of thin films on a substrate, and comprises the steps of: forming a plurality of thin films on a surface of a transfer member; and joining, to the substrate, the transfer member having the plurality of thin films formed thereon for collectively transferring the plurality of thin films to the substrate.

The substrate may be a semiconductor wafer, a glass substrate for a liquid-crystal-display-panel, a glass substrate for a plasma-display-panel, a print-circuit board or the like. Further, the substrate may be an interposer serving as an insulating substrate to be used for re-wiring in a chip-size-package (CSP)-type semiconductor device.

The plurality of thin films may comprise films of different types to be formed in the same layer on the substrate. For example, the plurality of thin films may comprise an insulating film and a conductive film (wiring film) to be formed in the same layer.

The plurality of thin films may comprise thin films to be formed in different layers. In such a case, the thin films laminated in a plurality of layers are collectively transferred to the substrate from the transfer member.

According to the present invention, a plurality of thin films are previously formed on the surface of the transfer member, and these thin films are collectively transferred to the substrate surface. This reduces the number of transfer processing times. This not only improves the productivity, but also remarkably reduces the cost required for the thin film forming processing.

These and other features, objects, advantages and effects of the present invention will be more fully apparent from the following detailed description set forth below when taken in conjunction with the accompanying drawings.

BRIEF DESCRIPTION OF THE DRAWINGS

FIG. 3A and FIG. 3B are section views illustrating an example of a metallic-wiring-film-pattern forming method when the base material of the transfer member is made of a conductive material such as metal or the like;

DESCRIPTION OF THE PREFERRED EMBODIMENTS

Figure 1A:
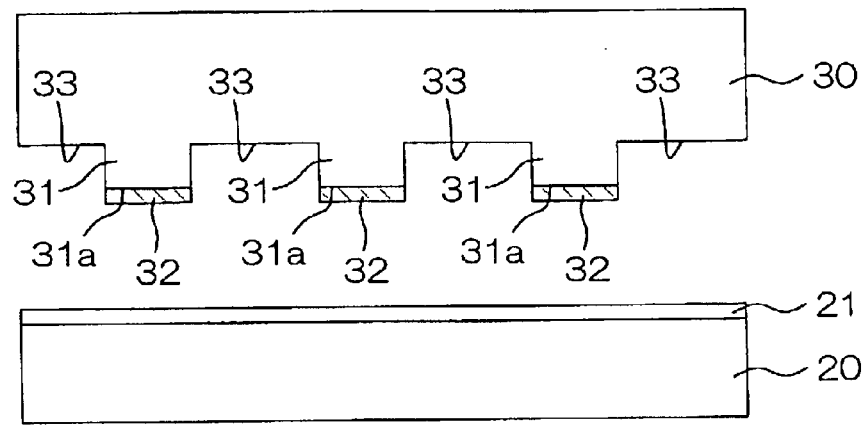
FIG. 1A to FIG. 1C are schematic section views illustrating a wiring forming method according to an embodiment of the present invention.
Figure 1B:
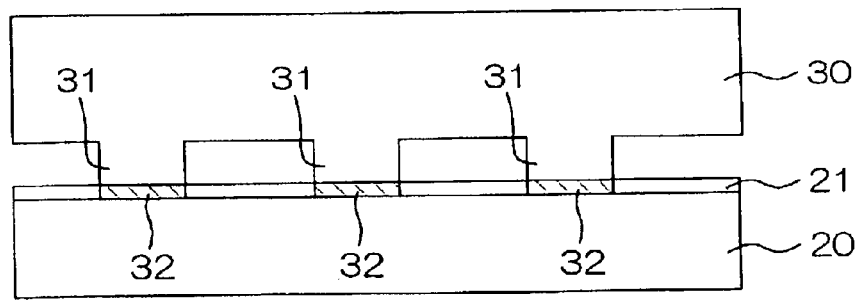
Figure 1C:
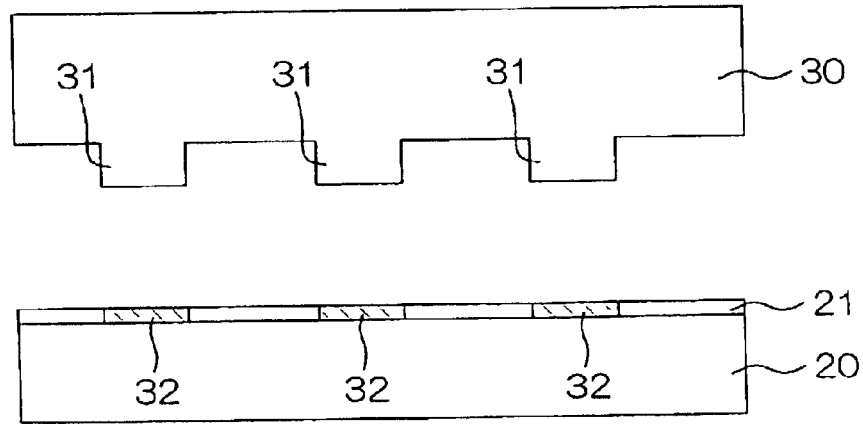

FIG. 1A to FIG. 1C are schematic section views illustrating a wiring forming method according to an embodiment of the present invention. First, there is prepared a semiconductor wafer (hereinafter simply referred to as wafer) 20 provided on the surface thereof with a gelatinous insulating film 21. Further, there is prepared a transfer member 30 having a surface on which projection-recess patterns are formed. The projecting portions 31 of the transfer member 30 have surfaces serving as thin-film carrying faces 31a. Metallic wiring film patterns 32 are formed on the thin-film carrying faces 31a. The projecting portions 31 of the transfer member 30 are formed in patterns corresponding to the wiring patterns to be formed on the wafer 20. Accordingly, the metallic wiring film patterns 32 are also formed in the wiring patterns to be formed on the wafer 20.

As shown in FIG. 1A, the wafer 20 and the transfer member 30 are disposed with the insulating film 21 and the metallic wiring film patterns 32 being opposite to each other. Then, the transfer member 30 and the wafer 20 are joined to each other as shown in FIG. 1B. Since the insulating film 21 is a gelatinous film, the metallic wiring film patterns 32 come into the inside of the insulating film 21 from the surface thereof.

Then, the wafer 20 and the transfer member 30 are separated from each other as shown in FIG. 1C. Accordingly, the metallic wiring film patterns 32 are transferred to the wafer 20 from the transfer member 30 and embedded in the insulating film 21.

Figure 2A:
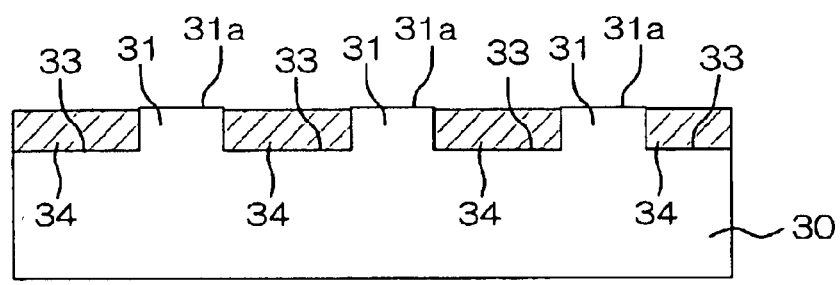
FIG. 2A to FIG. 2C are section views illustrating an example of the process of forming a metallic wiring pattern on the surface of a transfer member.
Figure 2B:
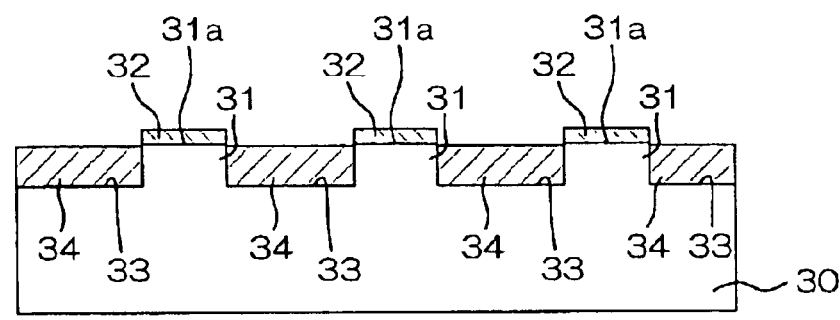
Figure 2C:
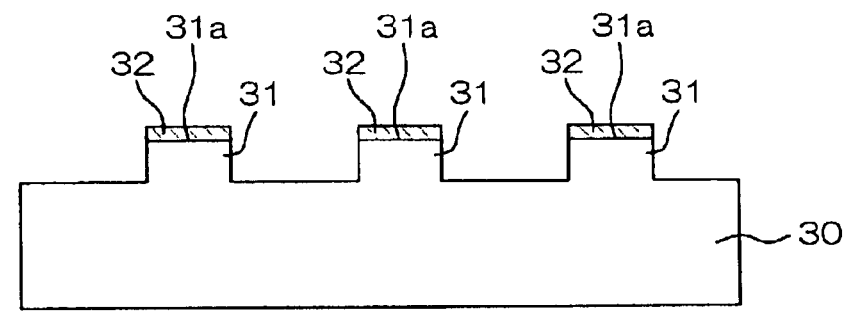

FIG. 2A to FIG. 2C are section views illustrating an example of the process of forming the metallic wiring film patterns 32 on the surface of the transfer member 30. First, resists 34 are embedded in recess portions 33 in the surface of the transfer member 30 as shown in FIG. 2A. Then, the transfer member 30 in the state in FIG. 2A is immersed in a plating solution such that the metallic wiring film patterns 32 are grown on the thin-film carrying faces 31a by an electroless plating method.

As shown in FIG. 2C, the resists 34 are then exfoliated, thus obtaining the transfer member 30 in which the metallic wiring film patterns 32 are selectively being formed on the thin-film carrying faces 31a of the projecting portions 31.

This process of growing the metallic wiring film patterns 32 by an electroless plating method, is particularly effective for the case where the base material of the transfer member 30 is an insulating material of quartz for example.

The projection-recess patterns on the surface of the transfer member 30 can be formed by a normal photolithography. More specifically, resist films corresponding to the patterns of the projecting portions 31 are formed on the surface of the flat transfer member 30, and with the resist films serving as masks, etching is conducted, thus forming the recess portions 33. Thereafter, when the resist films are exfoliated, there is obtained the transfer member 30 having the projecting portions 31 corresponding to the desired wiring patterns.

Figure 3A:
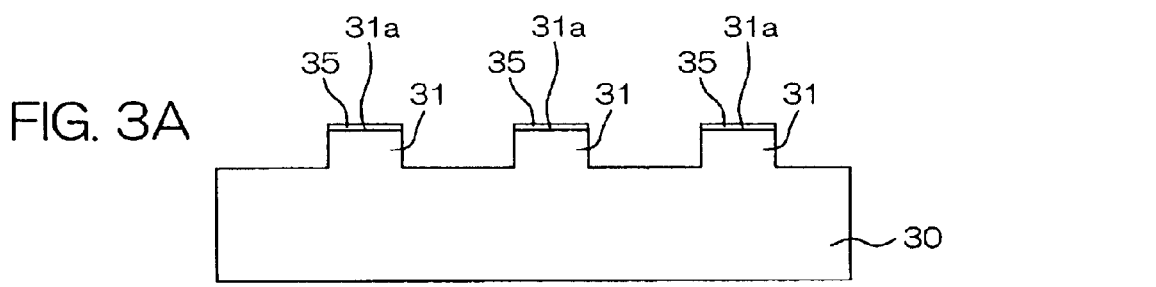
Figure 3B:
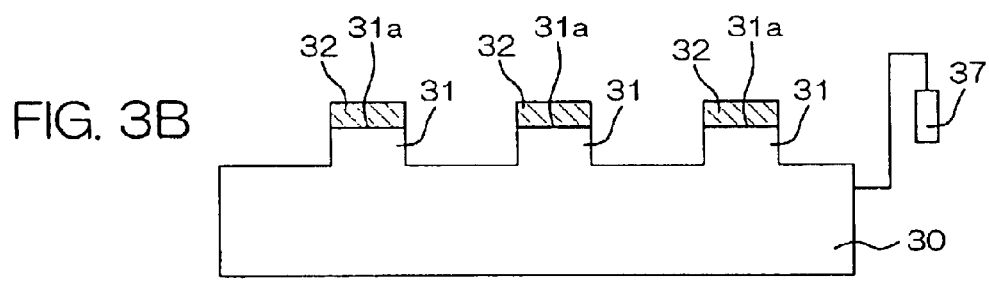

FIG. 3A and FIG. 3B are section views illustrating an example of a method of forming the metallic wiring film patterns 32 when the base material of the transfer member 30 is made of a conductive material such as metal. First, as shown in FIG. 3A, seed films 35 are formed on the thin-film carrying faces 31a of the projecting portions 31 by a sputter method or a CVD (chemical vapor deposition) method. The transfer member 30 in the state shown in FIG. 3A is immersed in a plating solution, and electroplating is conducted with the transfer member 30 connected to one electrode 37. Thus, metallic wiring film patterns 32 each having the desired film thickness can be grown on the thin-film carrying faces 31a on which the seed films 35 are formed.

Figure 4:
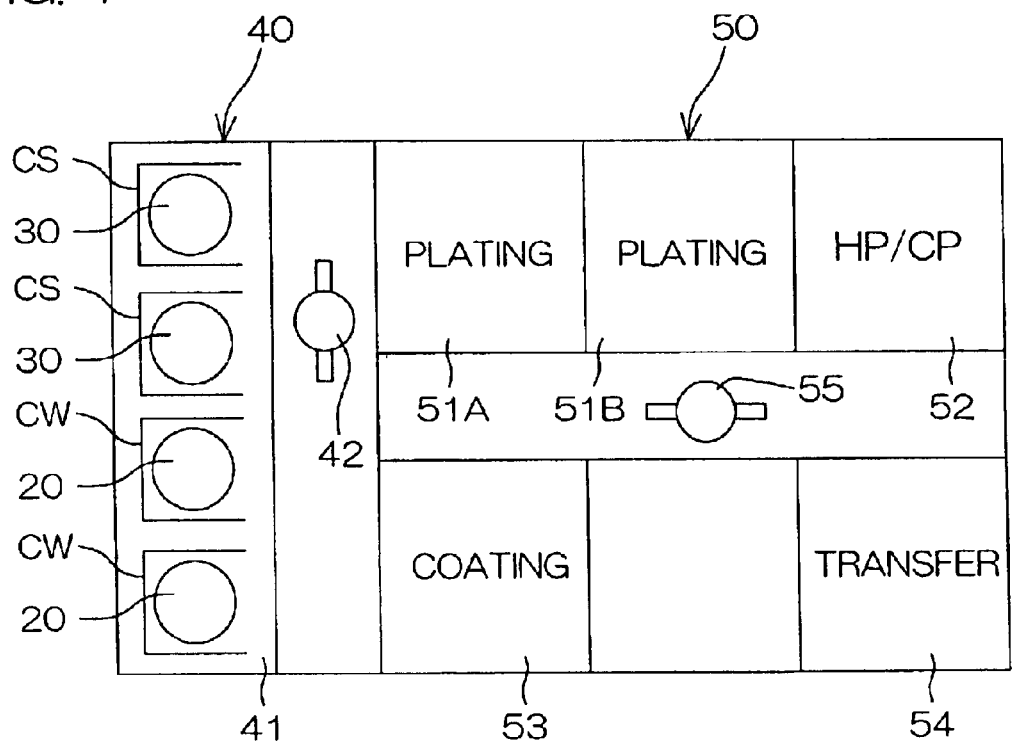
FIG. 4 is a schematic plan view illustrating the layout of a substrate processing apparatus for executing the wiring forming process above-mentioned.

FIG. 4 is a schematic plan view illustrating the layout of a substrate processing apparatus for executing the wiring forming process above-mentioned. This substrate processing apparatus has an indexer section 40 and a substrate processing section 50 in combination therewith.

The indexer section 40 has a cassette placing section 41 in which there can be placed, as arranged along a predetermined cassette arrangement direction, cassettes CS in each of which a plurality of transfer members 30 can be housed, and cassettes CW in each of which a plurality of wafers 20 can be housed. The indexer section 40 further has an indexer robot 42 which is arranged to take out a transfer member 30 or a wafer 20 from a cassette placed in the cassette placing section 41 and to hand it to the substrate processing section 50, and which is also arranged to receive a used transfer member 30 or a treated wafer 20 from the substrate processing section 50 and to house it in the cassette CS or CW.

The substrate processing section 50 comprises plating processing sections 51A, 51B for forming the metallic wiring film patterns 32 on the surface of a transfer member 30, a heating processing section 52 in which hot plates (HP) for heating a wafer W and cool plates (CP) for cooling the same to an ambient temperature, are stacked in multiple stages, a coating processing section 53 such as a spin coater or the like for coating the surface of a wafer 20 with a gelatinous insulating film 21, and a transfer processing section 54 for joining a wafer 20 and a transfer member 30 to each other.

The substrate processing section 50 further comprises a main conveyance robot 55 for carrying a wafer 20 or a transfer member 30 in and out from the plating processing sections 51A, 51B, the heating processing section 52, the coating processing section 53 and the transfer processing section 54. The main conveyance robot 55 is arranged to receive an unused transfer member 30 from the indexer robot 42, to carry it in the plating processing section 51A or 51B, to receive a plated transfer member 30 from the plating processing section 51A or 51B, and to carry it in the transfer processing section 54. The transfer member 30 after used in the transfer processing section 54, is carried out and then transferred to the indexer robot 42 by the main conveyance robot 55. Then, the indexer robot 42 houses this transfer member 30 in a cassette CS.

On the other hand, an untreated wafer 20 is taken out from a cassette CW and transferred to the main conveyance robot 55 by the indexer robot 42. The main conveyance robot 55 first carries the wafer 20 in the coating processing section 53, where the wafer 20 is coated with the material film of the insulating film 21. As necessary, the wafer 20 thus coated is carried in the heating processing section 52, where the wafer 20 is subjected to heating and cooling processings. In the manner above-mentioned, the gelatinous insulating film 21 is formed on the surface of the wafer 20.

Thereafter, the main conveyance robot 55 takes out the wafer 20 from the heating processing section 52 and carries it in the transfer processing section 54. At the transfer processing section 54, the processings shown in FIG. 1A to FIG. 1C, are executed so that the metallic wiring film patterns 32 are transferred from the surface of the transfer member 30 to the wafer 20. As necessary, the wafer 20 having the metallic wiring film patterns 32 transferred thereto, is carried in the heating processing section 52, where the wafer 20 is subjected to a heating processing for hardening the insulating film 21. Thereafter, the wafer 20 is cooled to an ambient temperature, and then carried out by the main conveyance robot 55. This treated wafer 20 is transferred to the indexer robot 42 and then housed in a cassette CW.

Figure 5:
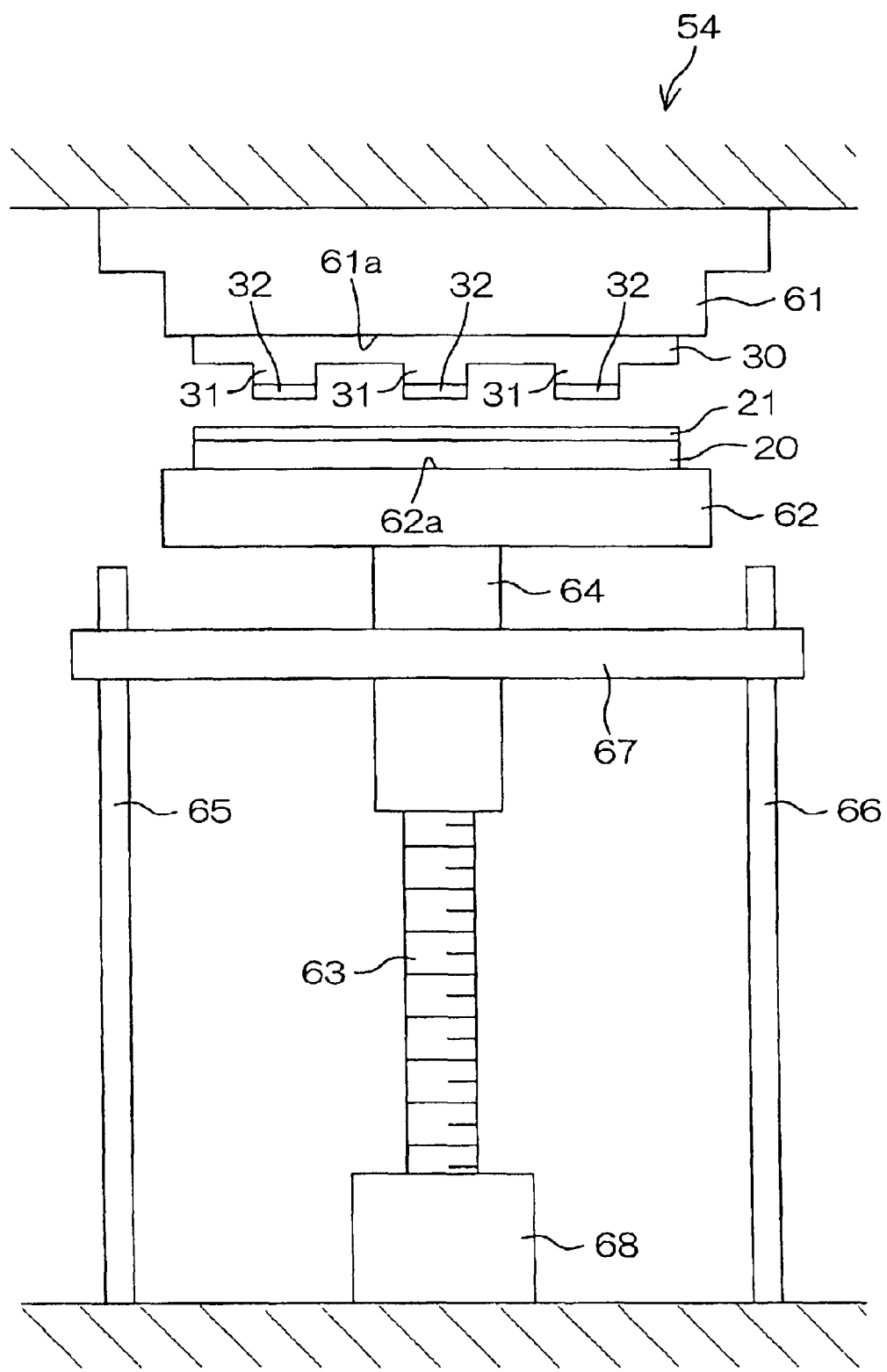
FIG. 5 is a schematic view illustrating an example of the arrangement of the transfer processing section.

FIG. 5 is a schematic view illustrating an example of the arrangement of the transfer processing section 54. This transfer processing section 54 comprises a stationary stage 61 which suctions and holds a transfer member 30 with the projecting portions 31 faced downwardly, and a movable stage 62 which suctions and holds a wafer 20 with the insulating film 21 faced upwardly. The stationary stage 61 and the movable stage 62 may respectively be arranged to suctions and holds a transfer member 30 and a wafer 20 by an electrostatic chucking method or a vacuum chucking method.

The stationary stage 61 and the movable stage 62 respectively have holding faces 61a and 62a which suctions and holds a transfer member 30 and a wafer 20, respectively. These stationary and movable stages 61, 62 are disposed with their holding faces 61a, 62a vertically opposite to each other. Connected to the movable stage 62 is a ball nut 64 threadedly connected to a vertically extending ball screw 63. This ball nut 64 is fixed to a bracket 67 which is vertically guided by linear guides 65, 66. Provision is made such that rotational force from a motor 68 is transferred to the ball screw 63. Accordingly, the forward/reverse rotation of the motor 68 causes the ball screw 63 to be rotated so that the movable stage 62 connected to the ball nut 64 is vertically moved. This enables the movable stage 62 to be moved toward and away from the stationary stage 61.

With the stationary stage 61 suctioning and holding a transfer member 30 carrying the metallic wiring film patterns 32 and with the movable stage 62 suctioning and holding a wafer 20 provided on the surface thereof with the gelatinous insulating film 21, the movable stage 62 is upwardly moved and brought close to the stationary stage 61. This makes the wafer 20 and the transfer member 30 stick together, thus providing the state shown in FIG. 1B.

Thereafter, the motor 68 is inversely rotated to separate the movable stage 62 from the stationary stage 61. This transfers the metallic wiring film patterns 32 to the wafer 20 side.

According to the embodiment having the arrangement above-mentioned, the previously formed metallic wiring film patterns 32 can be embedded in the insulating film 21 on the wafer 20 with no photolithography processing executed on the wafer 20. Further, a CMP processing is neither required. Accordingly, compared to a conventional damascene method, the wiring patterns can be formed on a wafer 20 with an extremely simple process, enabling the semiconductor production cost to be reduced.

Figure 6A:
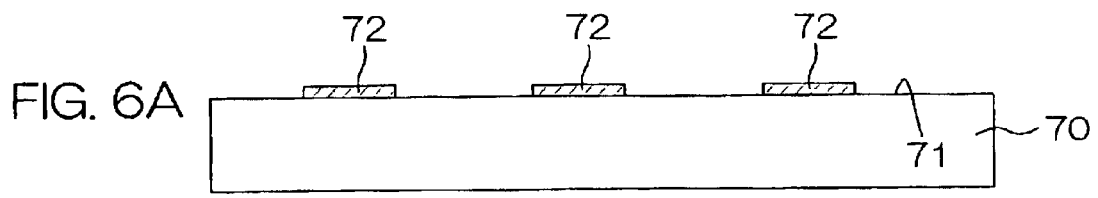
FIG. 6A and FIG. 6B are views illustrating the arrangement of the transfer member used in another embodiment of the present invention.
Figure 6B:
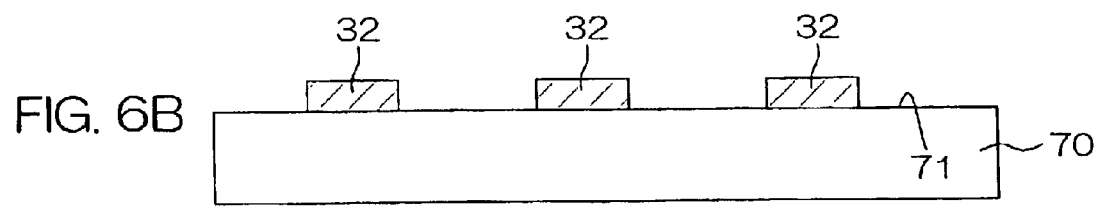

FIG. 6A and FIG. 6B are views illustrating the arrangement of a transfer member 70 used in another embodiment of the present invention. This transfer member 70 is used instead of the transfer member 30 above-mentioned, and is not provided on either surface with projection-recess portions. Seed films 72 corresponding to the patterns of metallic wiring film patterns 32, are formed on one surface (thin film carrying surface) 71 of the transfer member 70 by a sputtering or CVD method. Thereafter, the metallic wiring film patterns 32 are grown on the seed films 72 by an electroless plating or electroplating method. The electroless plating method is suitably applied when the base material of the transfer member 70 is an insulating material such as quartz or the like, and the electroplating is suitably applied when the base material of the transfer member 70 is a conductive material such as metal or the like.

The description has been made of an example in which the metallic wiring film patterns are transferred from a transfer member to a wafer. However, there can also be executed, in a similar manner, a processing in which other thin film patterns than the metallic wiring film patterns are transferred from a transfer member to a substrate.

In the embodiment above-mentioned, the description has been made of an example in which the metallic wiring film patterns 32 are embedded in the insulating film 21 on the wafer 20. However, the insulating film 21 may previously be solidified and the metallic wiring film patterns 32 may be transferred as being protuberant on the surface of the insulating film 21.

In the embodiment above-mentioned, a semiconductor wafer is used as an example of the substrate. However, there can also be executed, in a similar manner, a processing of forming thin film patterns on any of a variety of substrates to be treated, such as a glass substrate for a liquid-crystal-display-panel, a glass substrate for a plasma-display-panel, a print-circuit board and the like.

Examples of the metal which forms the metallic wiring film patterns 32 in the embodiments above-mentioned, include copper, aluminum, titan, tungsten and a mixture thereof.

Examples of the material which forms the insulating film 21, include an organic insulating film, a low dielectric interlayer insulating film, SOD (Spin On Dielectric), SOG and the like.

Further, provision may be made such that there is prepared a flat plate having an area larger than the pattern forming portion of the wafer 20, that this flat plate is mounted, instead of the transfer member 30, on the stationary stage 61 of the transfer processing section 54, and that the top of the wafer 20 having the metallic wiring film patterns 32 embedded in the insulating film 21, is pressed against this flat plate. In such an arrangement, the flatness of the top of the insulating film 21 can further be increased. Preferably, the flat plate is a polished quartz plate.

Provision may be made such that in FIG. 4, a flattening processing section having an arrangement identical with that of the transfer processing section 54, is disposed between the coating processing section 53 and the transfer processing section 54, and that only embedding of the metallic wiring film patterns 32 in the insulating film 21 is executed at the transfer processing section 54, while only flattening of the insulating film 21 by the flat plate is executed at the flattening processing section. Such an arrangement improves the throughput.

It is preferable that heating means such as a heater is disposed at the stationary stage 61 and the movable stage 62 at the flattening processing section, and that the flat plate is heated and the insulating film 21 is heated through the wafer 20, while the insulating film 21 is pressed against the flat plate.

Even though provision is not made such that a flat plate is disposed at the flattening processing section, the stationary stage 61 itself may be made of quartz or the like and the surface coming in contact with the insulating film 21 may be flattened.

In the transfer processing section 54 in FIG. 5, the transfer member 30 is held by the stationary stage 61 and the wafer 20 is held by the movable stage 62. However, provision may be made such that the wafer 20 is held by the stationary stage 61 and the transfer member 30 is held by the movable stage 62.

In the transfer processing section 54 in FIG. 5, the stationary stage 61 is disposed above the movable stage 62. However, the stationary stage may be disposed under the movable stage.

Provision may be made such that the both stages respectively holding the transfer member 30 and the wafer 20 are movable, and that these movable stages are moved toward or away from each other to transfer the thin film patterns on the transfer member 30 to the wafer 20.

The two stages respectively holding the transfer member 30 and the wafer 20, are not necessarily disposed opposite in a vertical direction, but may be disposed opposite in a horizontal direction.

Figure 7A:
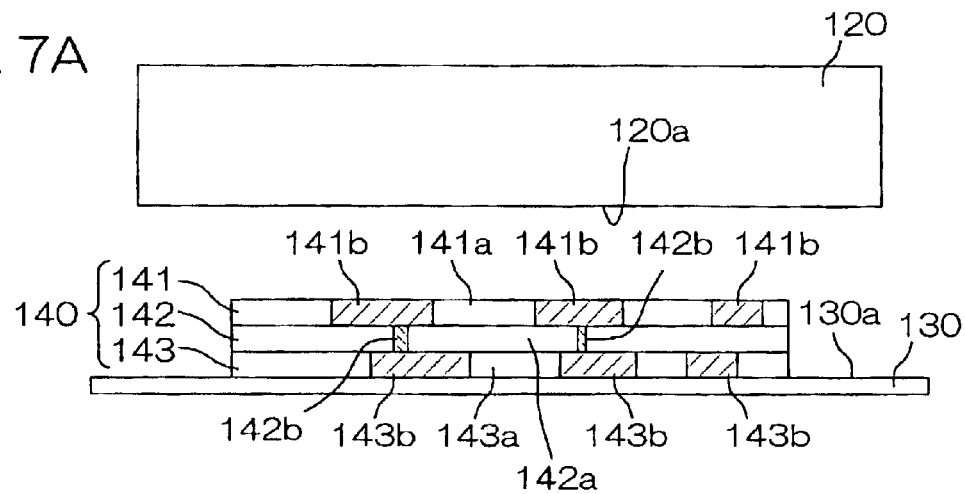
FIG. 7A to FIG. 7C are schematic section views illustrating a thin film forming method according to a further embodiment of the present invention.
Figure 7B:
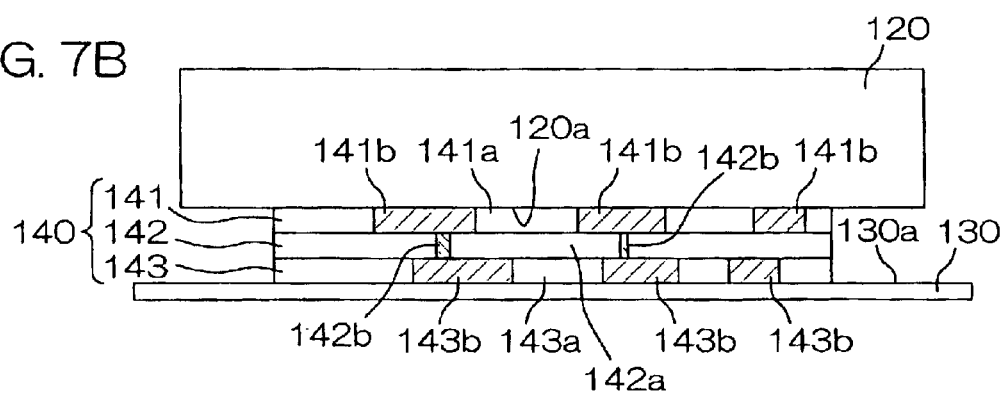
Figure 7C:
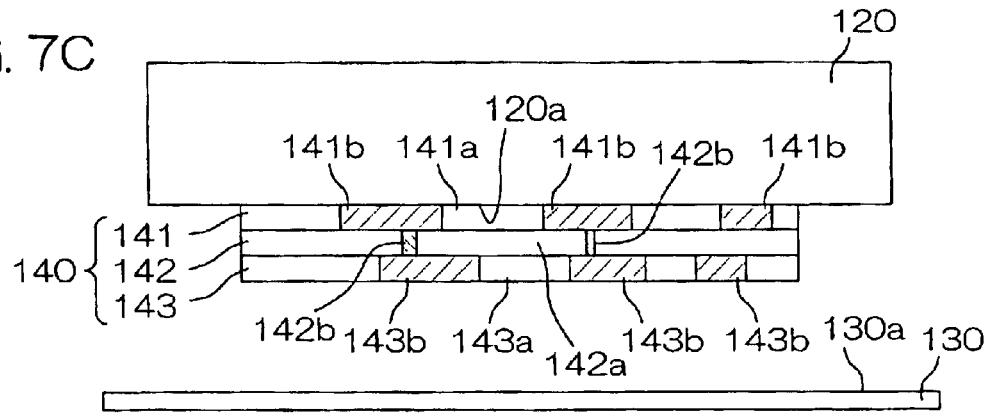

FIG. 7A to FIG. 7C are schematic section views illustrating a thin film forming method according to a further embodiment of the present invention. A semiconductor wafer (hereinafter simply referred to as wafer) 120 is disposed opposite to a transfer sheet 130 made of fluoroplastics or the like. The transfer sheet 130 is made in a circle slightly larger than that of the wafer 120. The transfer sheet 130 has a carrying face 130a to be opposite to the wafer 120. A multi-layer wiring thin-film structure 140 is carried by the carrying face 130a. The wafer 120 has an active face 120a which is disposed as opposite to the multi-layer wiring thin-film structure 140.

The multi-layer wiring thin-film structure 140 is composed of a plurality of thin film layers 141, 142, 143 in lamination. All thin film layers 141, 142, 143 are to be formed, in lamination, on the active face 120a of the wafer 120. Actually, these thin film layers 141, 142, 143 are laminated on the carrying face 130a of the transfer sheet 130 such that a thin film layer to be laminated at a position closer to the active face 120a of the wafer 120, is formed as an upper thin film layer.

The uppermost thin film layer 141 on the carrying face 130a of the transfer sheet 130 comprises, in the same layer, insulating film 141a and metallic wiring films 141b. More specifically, the metallic wiring films 141b are embedded in the insulating film 141a. The lowermost thin film layer 143 on the carrying face 130a of the transfer sheet 130 comprises, in the same layer, insulating film 143a and metallic wiring films 143b. The thin film layer 142 interposed between the thin film layers 141, 143 comprises, in the same layer, insulating film 142a and metallic wiring films 142b for connecting the upper and lower metallic wiring films 141b, 143b to each other.

From the state shown in FIG. 7A, the wafer 120 and the transfer sheet 130 are brought close to each other and then joined to each other as shown in FIG. 7B. In the state shown in FIG. 7B, when only the transfer sheet 130 is separated from the thin film layer 143, the multi-layer wiring thin-film structure 140 is resultantly transferred to the active face 120a of the wafer 120 as shown in FIG. 7C. Thus, a plurality of thin film layers 141, 142, 143 comprising insulating films and metallic wiring films, are collectively transferred to the wafer 120. This remarkably improves the productivity as compared to a method in which each film layer of one type is transferred one by one onto the surface of the wafer 120 to form a multi-layer wiring thin-film structure 140 on the wafer 120. Further, the process is remarkably simplified. This accordingly reduces the semiconductor device production cost.

Figure 8:
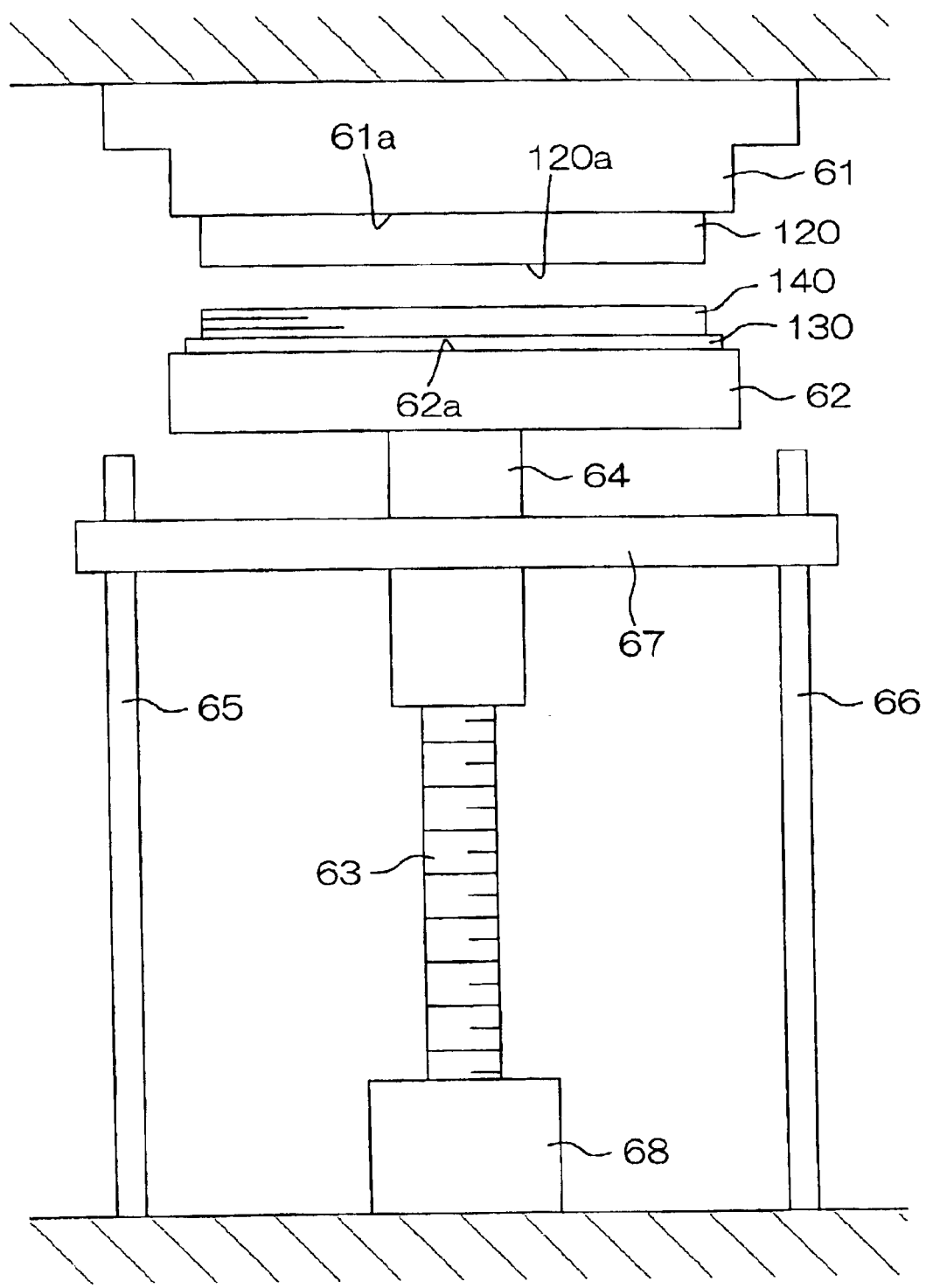
FIG. 8 is a schematic view illustrating the arrangement of a transfer processing apparatus for transferring a thin film layer from the transfer sheet to the wafer.

FIG. 8 is a schematic view illustrating the arrangement of a transfer processing apparatus for transferring the plurality of thin film layers 141 to 143, which form the multi-layer wiring thin-film structure 140, from the transfer sheet 130 to the wafer 120. The transfer processing apparatus has an arrangement similar to that of the transfer processing apparatus shown in FIG. 5. In FIG. 8, like parts are designated by like reference numerals used in FIG. 5 with the description of like parts omitted.

A stationary stage 61 suctions and holds a wafer 120 with an active face 120a faced downwardly. A movable stage 62 suctions and holds a transfer sheet 130 with a multi-layer wiring thin-film structure 140 faced upwardly. The stationary stage 61 and the movable stage 62 respectively have holding faces 61a, 62a for respectively suctioning and holding the wafer 120 and the transfer sheet 130. The stationary and movable stages 61, 62 are disposed with the holding faces 61a, 62a being vertically opposite to each other.

With the wafer 120 suctioned and held by the stationary stage 61 and with the transfer sheet 130 having the multi-layer wiring thin-film structure 140 on the carrying face 130a suctioned and held by the movable stage 62, the movable stage 62 is moved up and brought close to the stationary stage 61. This causes the wafer 120 and the transfer sheet 130 to be joined to each other, thus providing the state shown in FIG. 7B.

Thereafter, a motor 68 is inversely rotated, causing the movable stage 62 to be separated from the stationary stage 61. This enables the multi-layer wiring thin-film structure 140 to be transferred from the transfer sheet 130 to the wafer 120 side.

Figure 9A:
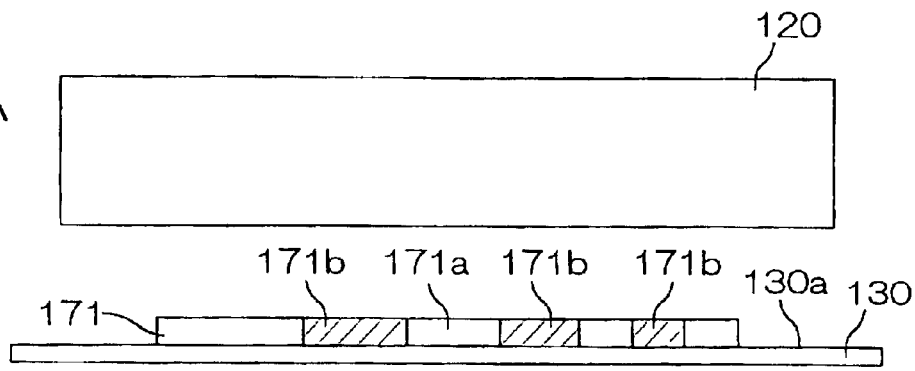
FIG. 9A to FIG. 9C are schematic section views illustrating a thin film forming method according to still another embodiment of the present invention.
Figure 9B:
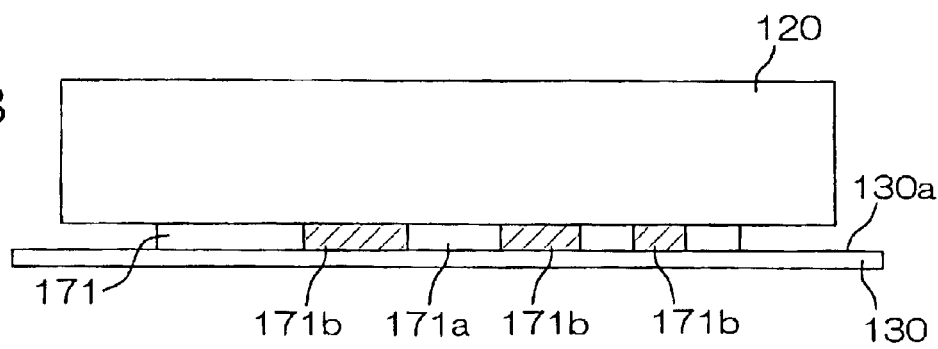
Figure 9C:
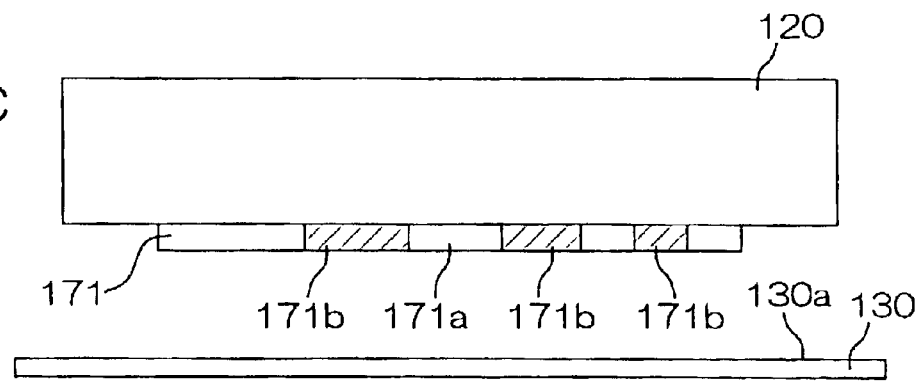

FIG. 9A to FIG. 9C are schematic section views illustrating a thin film forming method according to still another embodiment of the present invention. According to this embodiment, a single thin film layer 171 is formed on a carrying face 130a of a transfer sheet 130 as shown in FIG. 9A. This thin film layer 171 is a flat thin film having insulating film 171a and metallic wiring films 171b embedded therein. The transfer sheet 130 having such a thin film layer 171 formed thereon is joined to a wafer 120, thus providing the state in FIG. 9B. Then, when only the transfer sheet 130 is separated, the thin film layer 171 is transferred to the wafer 120 as shown in FIG. 9C. Thus, with a single transfer processing, the insulating film 171a and the metallic wiring films 171b embedded therein are formed on the surface of the wafer 120.

Figure 10:
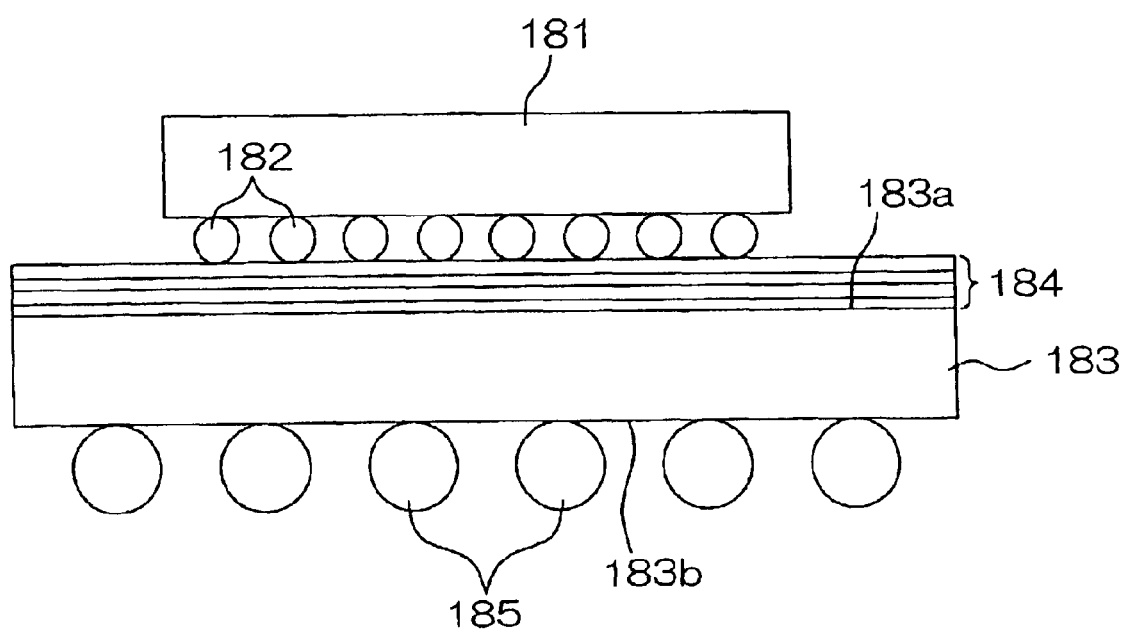
FIG. 10 is a schematic section view of a chip-size-package (CSP)-type semiconductor device, illustrating a still further embodiment of the present invention; and FIG. 11A to FIG. 11D is a schematic section view illustrating a wiring forming process according to a damascene method.
Figure 11A:
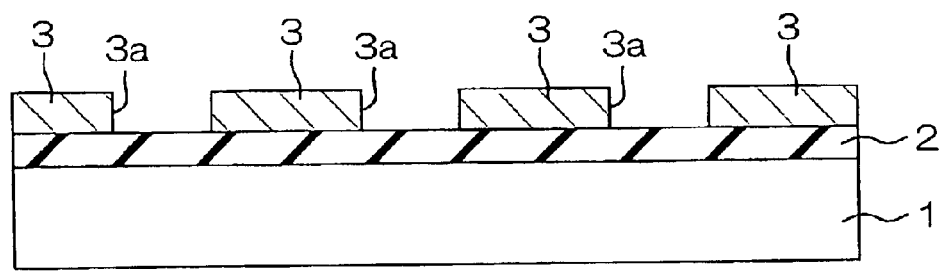
Figure 11B:
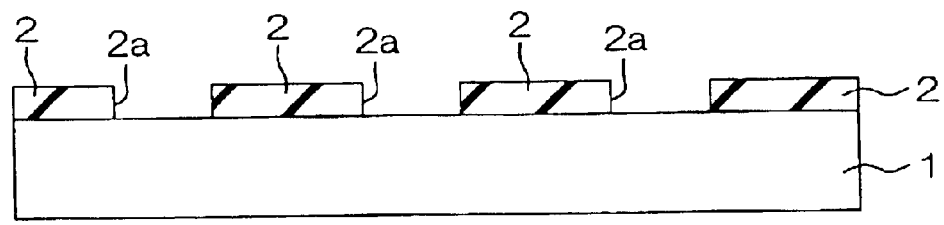
Figure 11C:
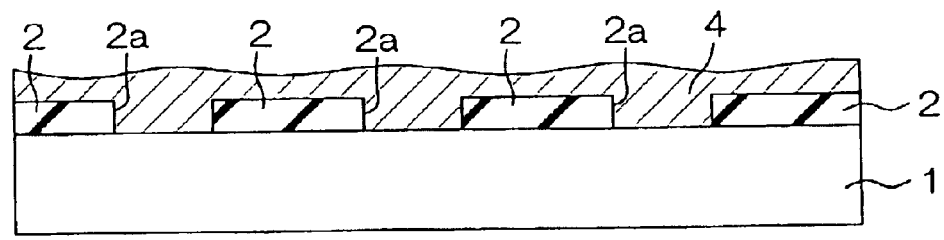
Figure 11D:
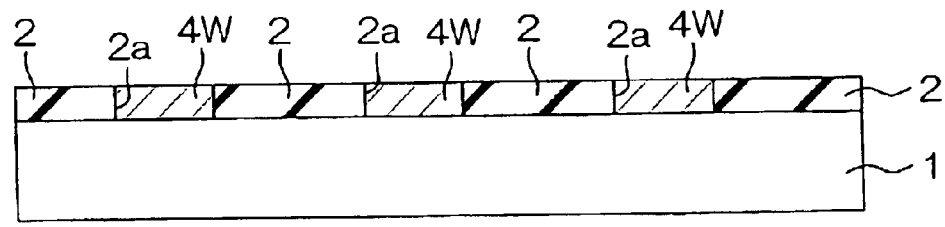

FIG. 10 is a schematic section view of a chip-size-package (CSP)-type semiconductor device, illustrating a still further embodiment of the present invention. A semiconductor chip 181 is bonded, through external connection terminals 182 such as solder balls or the like disposed on the active faces thereof, to an interposer 183 serving as an insulating substrate. The interposer 183 is provided on one surface 183a thereof with a multi-layer wiring structure 184 comprising a plurality of thin films, and on the other surface 183b thereof with external connection terminals 185 such as solder balls or the like.

The external connection terminals 182 disposed at the underside of the semiconductor chip 181, are arranged for example in one row along the periphery of the semiconductor chip 181. On the other hand, the external connection terminals 185 formed on the surface 183b of the interposer 183 are arranged in a two-dimensional manner. The multi-layer wiring structure 184 incorporates three-dimensional wirings for re-wiring the external connection terminals 182 of the semiconductor chip 181 to the external connection terminals 185 of the interposer 183.

The thin film forming method of the present invention can be applied for forming the multi-layer wiring structure 184 on one surface 183a of the interposer 183. More specifically, the multi-layer wiring structure 184 may wholly or partially previously be formed on a transfer sheet, and the multi-layer wiring structure 184 may wholly or partially be transferred from this transfer sheet to the surface 183a of the interposer 183.

In the embodiment above-mentioned, a combination of insulating films and wiring metallic films is taken as an example of a plurality of thin films to be transferred from a transfer sheet to a wafer. However, provision maybe made such that insulating films of two or more different types (for example, silicon nitride films and SOG films) are formed in lamination on a transfer sheet, and that these insulating films of two or more different types are collectively transferred to the wafer 120.

In the embodiment above-mentioned, a semiconductor wafer is taken as an example of the substrate. A similar process can also be applied for forming a plurality of thin films on any of a variety of substrates to be processed, such as a glass substrate for a liquid-crystal-display-panel, a glass substrate for a plasma-display-panel, a print-circuit board and the like.

Examples of the metal which forms the metallic wiring film in the embodiments above-mentioned, include copper, aluminum, titan, tungsten and a mixture thereof.

Examples of the material of the insulating film include an organic insulating film, a low dielectric interlayer insulating film, SOD, SOG and the like.

In the transfer processing apparatus in FIG. 8, the wafer 120 is held by the stationary stage 61 and the transfer sheet 130 is held by the movable stage 62. However, provision may be made such that the transfer sheet 130 is held by the stationary stage 61 and the wafer 120 is held by the movable stage 62.

In the transfer processing apparatus in FIG. 8, the stationary stage 61 is disposed above the movable stage 62.

However, the stationary stage may be disposed under the movable stage.

Provision may be made such that the both stages respectively holding the wafer 120 and the transfer member 130, are movable, and that these movable stages are moved toward or away from each other to transfer a plurality of thin films on the transfer sheet 130 to the wafer 120.

The two stages respectively holding the wafer 120 and the transfer sheet 130, are not necessarily disposed opposite to each other in a vertical direction, but may be disposed opposite to each other in a horizontal direction.

Embodiments of the present invention have been discussed in detail, but these embodiments are mere specific examples for clarifying the technical features of the present invention. Therefore, the present invention should not be construed as limited to these specific examples. The spirit and scope of the present invention are limited only by the appended claims.

This Application corresponds to Japanese Patent Application Serial No. 2001-290719 filed on Sep. 25, 2001 with Japanese Patent Office, and to Japanese Patent Application Serial No. 2001-296037 filed on Sep. 27, 2001 with Japanese Patent Office, the disclosures of which are incorporated herein by reference.

What is claimed is:

1. A substrate processing apparatus for forming a thin film pattern on a surface of a substrate, comprising:
    a plating processing section for forming a metal wiring film pattern on a surface of a transfer member;
    a coating processing section for coating the surface of the substrate with an insulating film; and
    a transfer processing section for transferring the metal wiring film pattern, formed on the transfer member by the plating processing section, onto the substrate, on which the insulating film has been formed by the coating processing section;
    further comprising a main conveyance robot for carrying in or carrying out the substrate or the transfer member to or from the plating processing section.

2. A thin film forming apparatus according to claim 1, wherein said transfer member has a thin film carrying surface which carries a thin film pattern; and further comprising
    a thin film transfer mechanism for joining the transfer member to a substrate for transferring, to the substrate, the thin film pattern on the thin film carrying surface.

3. A thin film forming apparatus according to claim 1, wherein the thin film transfer mechanism is arranged to transfer the thin film pattern to a substrate on which a wiring pattern or device is to be formed.

4. A thin film forming apparatus according to claim 1, wherein the transfer member carries a wiring film pattern as the thin film pattern.

5. A thin film forming apparatus according to claim 1, wherein the transfer member is provided on a surface thereof with a recess portion and a projecting portion, the thin film carrying surface being formed on a surface of the projecting portion.

6. A thin film forming apparatus according to claim 1, wherein the transfer member has a flat surface, the thin film pattern being formed on a predetermined area of the flat surface.

7. A thin film forming apparatus according to claim 1, wherein said transfer mechanism collectively transfers, to the substrate, a plurality of thin films carried by the transfer member.

8. A substrate processing apparatus according to claim 1, further comprising:
    a heating processing section for subjecting the substrate, the insulating film being formed thereon by the coating processing section, to a heating process to change the insulating film to a gelatinous insulating film;
    wherein the transfer processing section transfers the metal wiring film pattern, formed on the transfer member by the plating processing section, to the gelatinous insulating film having been processed by the heating processing section.

9. A substrate processing apparatus for forming a thin film pattern on a surface of a substrate, comprising:
    a plating processing section for forming a metal wiring film pattern on a surface of a transfer member;
    a coating processing section for coating the surface of the substrate with an insulating film; and
    a transfer processing section for transferring the metal wiring film pattern, formed on the transfer member by the plating processing section, onto the substrate, on which the insulating film has been formed by the coating processing section;
    further comprising:
    a cassette placing section in which a cassette for housing a transfer member and a cassette for housing a substrate are placed; and
    an indexer robot for taking out a transfer member or a substrate from the cassette place in the cassette placing section to hand the same to a substrate processing section, and for receiving a used transfer member or a treated substrate from the substrate processing section to house the same to a cassette placed in the cassette placing section,
    wherein the substrate processing section includes the plating processing section, the coating processing section, and the transfer processing section.

10. A thin film forming apparatus according to claim 9, wherein said transfer member has a thin film carrying surface which carries a thin film pattern; and further comprising
    a thin film transfer mechanism for joining the transfer member to a substrate for transferring, to the substrate, the thin film pattern on the thin film carrying surface.

11. A thin film forming apparatus according to claim 10, wherein the thin film transfer mechanism is arranged to transfer the thin film pattern to a substrate on which a wiring pattern or device is to be formed.

12. A thin film forming apparatus according to claim 10, wherein the transfer member carries a wiring film pattern as the thin film pattern.

13. A thin film forming apparatus according to claim 10, wherein the transfer member is provided on a surface thereof with a recess portion and a projecting portion, the thin film carrying surface being formed on a surface of the projecting portion.

14. A thin film forming apparatus according to claim 10, wherein the transfer member has a flat surface, the thin film pattern being formed on a predetermined area of the flat surface.

15. A thin film forming apparatus according to claim 10, wherein said transfer mechanism collectively transfers, to the substrate, a plurality of thin films carried by the transfer member.

16. A substrate processing apparatus according to claim 9, further comprising: a heating processing section for subjecting the substrate, the insulating film being formed thereon by the coating processing section, to a heating process to change the insulating film to a gelatinous insulating film;

wherein the transfer processing section transfers the metal wiring film pattern, formed on the transfer member by the plating processing section, to the gelatinous insulating film having been processed by the heating processing section.

* * * * *